US007391122B1

(12) United States Patent  (10) Patent No.: US 7,391,122 B1
Hool  (45) Date of Patent: Jun. 24, 2008

(54) TECHNIQUES FOR FLIP CHIP PACKAGE MIGRATION (75) Inventor: Vincent Hool, Fremont, CA (US)

(73) Assignee: Altera Corporation, San Jose, CA (US)

( * ) Notice: Subject to any disclaimer, the term of this patent is extended or adjusted under 35 U.S.C. 154(b) by 115 days.

(21) Appl. No.: 11/073,326

(22) Filed: Mar. 4, 2005

(51) Int. Cl.
H01L 23/48 (2006.01)

(52) U.S. Cl. .................. 257/786; 257/723; 257/730; 257/737; 257/773; 257/777; 257/778; 257/E23.003; 257/E23.004; 257/E23.079; 257/E23.171; 257/E23.175; 257/E21.511

(58) Field of Classification Search .................. 257/723, 257/730, 737, 773, 776, 777, 778, 786, E23.003, 257/E23.004, E23.079, E23.171, E23.175, 257/E21.511
See application file for complete search history.

(56) References Cited

U.S. PATENT DOCUMENTS

| 6,184,713 | B1* | 2/2001 | Agrawal et al. ............... 326/41 |
| 6,297,565 | B1 | 10/2001 | Shiflet |
| 6,348,813 | B1* | 2/2002 | Agrawal et al. ............... 326/41 |
| 6,762,495 | B1* | 7/2004 | Reyes et al. .................. 257/737 |
| 6,861,740 | B2* | 3/2005 | Hsu ............................ 257/691 |
| 6,864,122 | B1* | 3/2005 | Huse et al. ................... 438/110 |
| 6,875,921 | B1* | 4/2005 | Conn .......................... 174/534 |
| 7,151,319 | B2* | 12/2006 | Iida et al. .................... 257/786 |
| 7,242,093 | B2* | 7/2007 | Ueda .......................... 257/737 |
| 2002/0113319 | A1* | 8/2002 | Ohno .......................... 257/778 |
| 2003/0201528 | A1* | 10/2003 | Hsu ............................ 257/691 |
| 2005/0016749 | A1* | 1/2005 | Seaman et al. ............. 174/52.01 |
| 2005/0151564 | A1* | 7/2005 | McClintock et al. .......... 326/83 |

* cited by examiner

Primary Examiner—Matthew S. Smith
Assistant Examiner—Jarrett J Stark
(74) Attorney, Agent, or Firm—Townsend and Townsend and Crew LLP (57) ABSTRACT Techniques for integrated circuit packaging in a flip chip configuration that ensures a migration path between related integrated circuits and utilizes core I/O (or area I/O) are provided. An integrated circuit, having a superset of functional circuit elements as compared to a reference integrated circuit, includes first and second sets of interconnection elements to connect to a package substrate. The first and second sets have matching arrangements, and corresponding interconnection elements of the first and second set have consistent functional assignments. The first and second sets include interconnection elements of mixed functional assignments. The first set is disposed within an area matching a size and shape of the reference integrated circuit, while the second set is disposed outside the area. In a specific embodiment, the first set includes an I/O signal and is located in the core area.

25 Claims, 8 Drawing Sheets

TECHNIQUES FOR FLIP CHIP PACKAGE MIGRATION

BACKGROUND OF THE INVENTION

The present invention relates to the field of integrated circuit technology, and more specifically to techniques for integrated circuit packaging in a flip chip configuration.

Integrated circuits (ICs) or "chips" can be bonded to a package substrate using a flip chip technique. An IC device configured for flip chip bonding includes solder bumps formed on interconnection pads on the active side of the device. The IC device is then "flipped" and bonded to a package substrate with a matching set of interconnection pads. The solder bumps form solder joints between the chip and the package substrate, which provide both mechanical and electrical interconnects.

Flip chip bonding techniques have been applied to programmable logic devices (PLDs), a type of programmable logic integrated circuit. PLDs typically have numerous logic blocks that can be configured to implement various combinatorial and sequential functions. These logic blocks have access to a programmable interconnect structure. The programmable interconnect structure can be programmed to interconnect the logic blocks in almost any desired configuration. Many of today's PLDs have on-chip nonprogrammable application specific integrated circuit (ASIC) blocks. The ASIC blocks are also referred to as hard intellectual property (HIP) blocks.

The internal architectures of PLD's vary but frequently a number of PLD's will share the same internal architecture and operating characteristics and be marketed as a family. The distinction between members in the family is the total number of functional logic elements included in each member. It is not uncommon for a product to include a PLD having a smaller number of functional logic elements than another member of its device family. The smaller PLD may have been chosen to reduce costs. However, if performance demands increase, the smaller PLD is sometimes replaced by a larger device of the same family. Up until now, however, package pins may not serve the same device input/output (I/O) signals across a family, thus a redesign would be required. Despite their common internal architecture that allowed migration between different packages in the family, their external packaging did not readily support migration.

Accordingly, there is a need in the art for integrated circuit packaging that ensures a migration path between related integrated circuits.

BRIEF SUMMARY OF THE INVENTION

The present invention provides techniques for integrated circuit packaging in a flip chip configuration. In particular, these techniques ensure a migration path between related integrated circuits by increased utilization of core I/O (or area I/O).

According to an embodiment of the present invention, an integrated circuit, having a superset of functional circuit elements as compared to a reference integrated circuit, includes identical first and second sets of interconnection elements to connect to a package substrate. The first set is disposed within an area matching a size and shape of the reference integrated circuit, while the second set is disposed outside the area.

Beside providing a migration path between related integrated circuits, these techniques make better use of the core area. I/O signals can be placed within the core area, which for a conventional integrated circuit is reserved for core power and ground. Array congestion of the interconnect elements (e.g., bumps or alternatively, balls) on the die periphery is reduced using the core area for migration and fine bump pitch can be avoided. Die size can also be reduced.

Other objects, features, and advantages of the present invention will become apparent upon consideration of the following detailed description and the accompanying drawings, in which like references designations represent like features throughout the figures.

DETAILED DESCRIPTION OF THE INVENTION

Figure 1A:
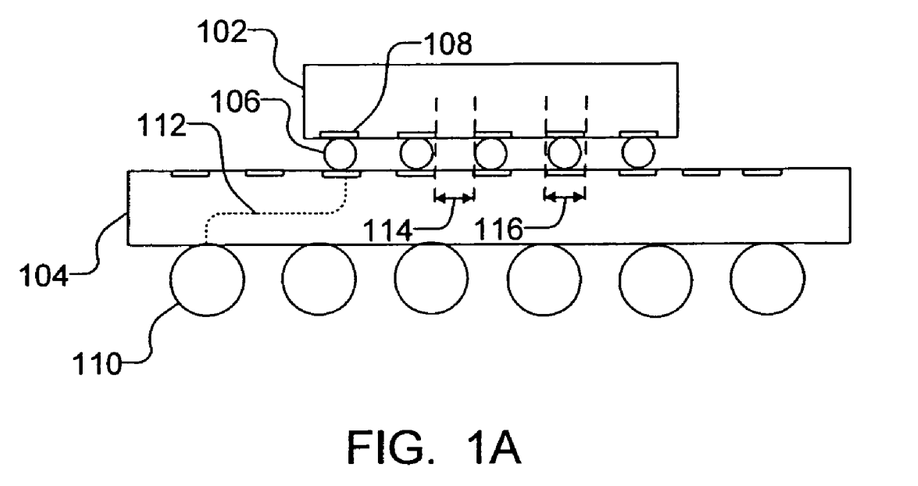
FIGS. 1A and 1B are simplified cross-sectional views of integrated circuit dies connected to package substrates according to an embodiment of the present invention.

FIG. 1A is cross-sectional view of a reference integrated circuit 102 connected to package substrate 104 according to an embodiment of the present invention. The active side of reference integrated circuit die 102 is mounted to a package substrate 104 via an array of interconnection elements. These interconnection elements provide both electrical and mechanical connections between reference integrated circuit 102 and package substrate 104.

Interconnection elements, such as interconnection element 106, can be bumps or solder balls. The diameter 116 of the bumps or solder balls can be in a range of about 80 microns to about 140 microns in a specific embodiment. In other embodiments, the bumps or solder balls may be any size including being smaller than 80 microns or larger than 140 microns. Furthermore, although this patent describes the interconnection elements as being bumps or balls, the interconnection elements may be formed in any desired shape (not just spherical) such as being conical, rectangular, pentagonal, hexagonal, octagonal, and many others.

The interconnection elements may be on die 102 or, alternatively, on substrate 104. In order to join die 102 to substrate 104, interconnection elements are heated to above the reflow temperature of the solder. In an embodiment, the reflow temperature of solder is typically about 180° C. to about 300° C. However, the exact reflow temperature will vary depending on the type of material and conditions under which the material is used. For example, a solder including a higher percentage of silver than another solder which includes more lead may have a higher reflow temperature.

In addition, the interconnection elements of the array are spaced sufficiently apart to allow at least one trace on the surface of substrate 104 to be routed from an inner portion of substrate 104 to the periphery of substrate 104. In a specific embodiment, the length 114 between interconnection elements is at least about 50 microns. In other embodiments, this length may be other values, including larger than 50 microns (e.g., 75 microns or 90 microns). In an embodiment, this length is greater than a size of the bump or solder ball (e.g., 90 microns is greater than a 80 micron ball). In another embodiment, this length is equal to the size of the bump or solder ball (e.g., 80 micron length and a 80 micron ball). In yet another embodiment, this length is less then the size of the bump or solder ball (e.g., 90 micron length and a 80 micron ball).

In the example illustrated in FIG. 1A, pad 108 is electrically connected to pin element 110 located on the underside of package substrate 104 via a conductive path 112. Conductive path 112 can run along the top, inner or bottom surfaces of substrate 104, as well as wholly or partially through substrate 104. Pad 108 of reference integrated circuit die 102 has a predetermined functional assignment. Functional assignments include, for example, core power, core ground, clock, control I/O, I/O signal, phase-locked loop (PLL) power/ground, I/O power and I/O ground. Depending on the specific application, there can be other functional assignments.

Figure 1B:
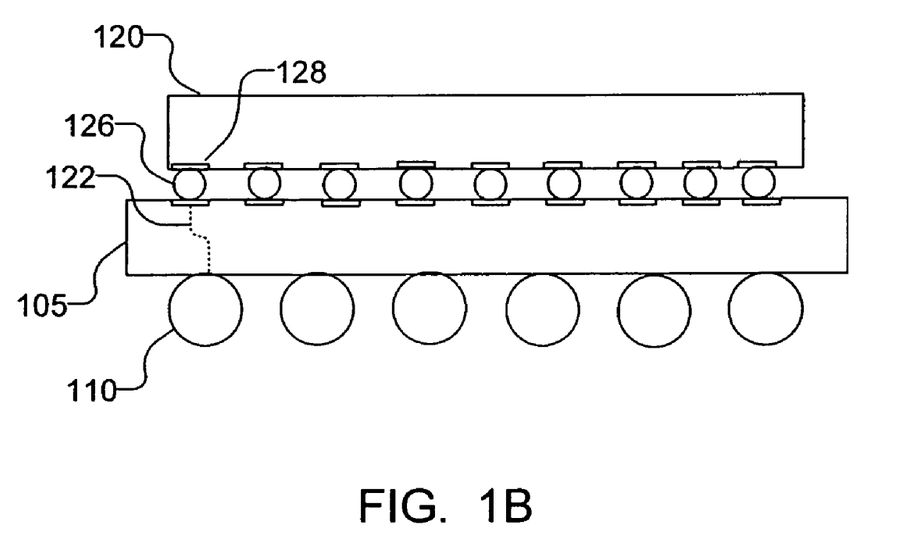

Referring to FIG. 1B, integrated circuit die 120 is connected to package substrate 105. Integrated circuit die 120 has a superset of functional circuit elements as compared to reference integrated circuit die 102, and thus in this example it has a larger active surface area than reference integrated circuit die 102. Pad 128 is coupled to pin element 110 via interconnect element 126 and conductive path 122. To ensure cost efficient migration to the integrated die 120 from reference integrated circuit die 102 (or vice versa), pad 128 has the same functional assignment as pad 108. Therefore, regardless of the integrated circuit die, designs can rely on the fact that pin element 110 is consistently assigned and little, if any, design changes will needed to migrate to, or from, integrated circuit die 120 and reference integrated circuit die 102.

Figure 2A:
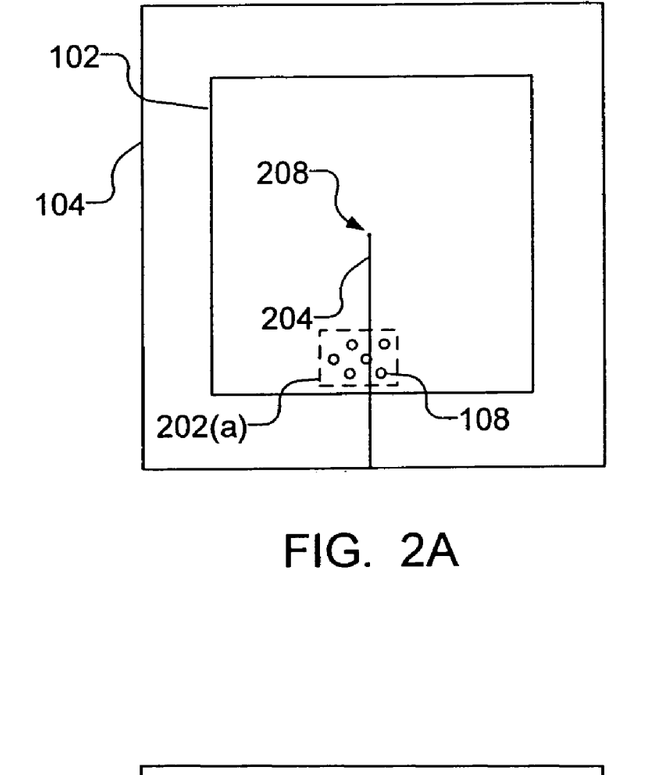
FIGS. 2A and 2B are simplified top views of integrated circuit dies connected to package substrates according to an embodiment of the present invention.
Figure 2B:
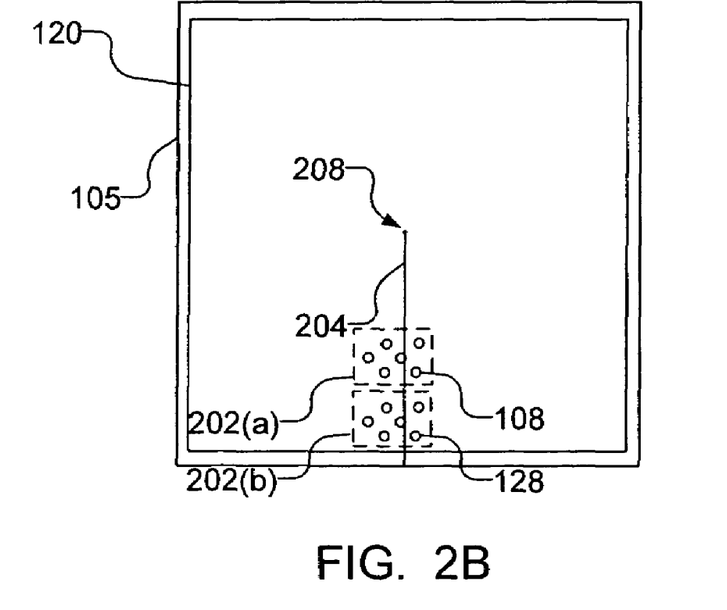

FIGS. 2A and 2B are top views of integrated circuits connected to package substrates according to an embodiment of the present invention. In particular, FIG. 2A shows a plurality of interconnection elements defining a set 202(*a*). Each interconnection element of set 202(*a*) is assigned a functional assignment. For example, interconnection element 108 can be a clock signal. In FIG. 2B, a second set of interconnects 202(*b*) having the same configuration of functional assignments is included in substrate 105. Therefore, interconnection element 128 is also a clock signal. In either case of substrates 104 and 105, pin element 110 defines a clock signal.

Figure 3A:
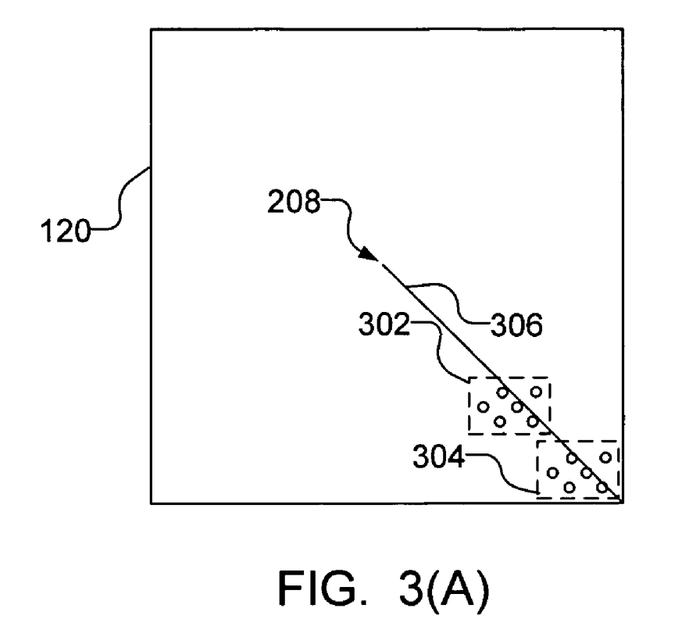
FIGS. 3A and 3B each illustrate a migration path for a set of interconnection elements according to an embodiment of the present invention.

According to an embodiment of the present invention, particular sets of interconnect elements are referred to herein as "special cells." Special cells can include all or some of interconnection elements with functional assignments of clock, control I/O, and/or PLL power/ground. These cells are preferably located at the middle and/or corner of the die periphery as such locations are easier to connect to the same element pin on the substrate. Under this circumstance, corresponding sets of interconnect elements (e.g., set 202(*a*) and set 202(*b*)) migrate outwards along line 204. Line 204 extends perpendicular to an edge of the die and includes center 208. FIG. 3A illustrates an alternative migration path for a special cell. In this example, corresponding special cells 302 and 304 migrate radially along line 306. Line 306 extends from center 208 to a corner of the die.

Figure 3B:
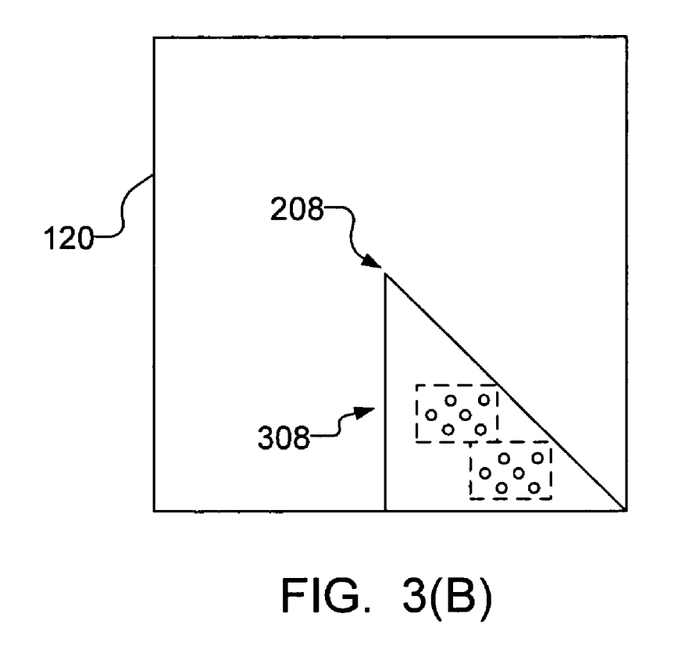

Another set of interconnect element sets is referred to herein as a "basic cell." Basic cells can include interconnection elements with function assignments of I/O signal, I/O power, and I/O ground. Corresponding sets of basic cells migrate radially outwards from center 208. In a specific embodiment, basic cells migrate within a single power bank 308 of the die. FIG. 3B shows an example of a migration path for a basic cell. It should be noted that a basic cell can placed be within the core area, which for a conventional integrated circuit is reserved for core power and ground. Accordingly, array congestion of the interconnect elements on the die periphery can be reduced using the core area for migration and fine bump pitch can be avoided.

Figure 4:
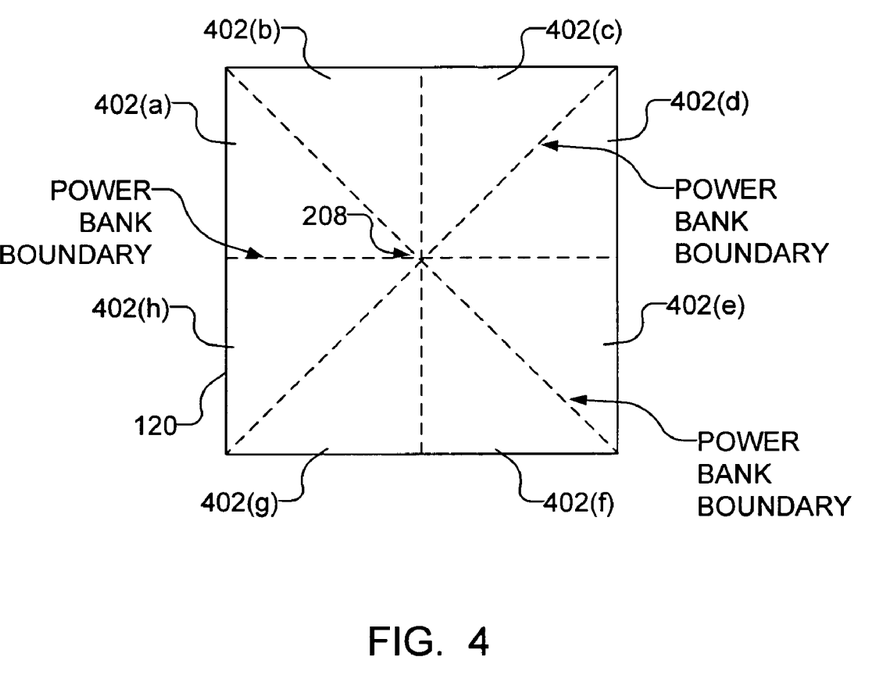
FIG. 4 illustrates the power bank boundaries of an integrated circuit die according to an embodiment of the present invention.

FIG. 4 shows power bank boundaries of an integrated circuit die 120 according to an embodiment of the present invention. Integrated circuits are often designed to use a plurality of reference voltages within isolated areas of the circuit, and the die can be partitioned by these areas. For example, integrated circuit die 120 can be partitioned into eight slices 402(*a*)-(*h*). All interconnection elements within slice 402(*a*) are adapted to use the same voltage standard; however, interconnection elements within slice 402(*e*) will operate on a different voltage standard. Typical voltage logic standards used by integrated circuits are 0-2.5 volts, 0-3.3 volts, 0-5 volts, 0-3 volts, 0-1.8 volts, 0-1.5 volts, differential 2.0 volts, and differential 1.4 volts.

Figure 5:
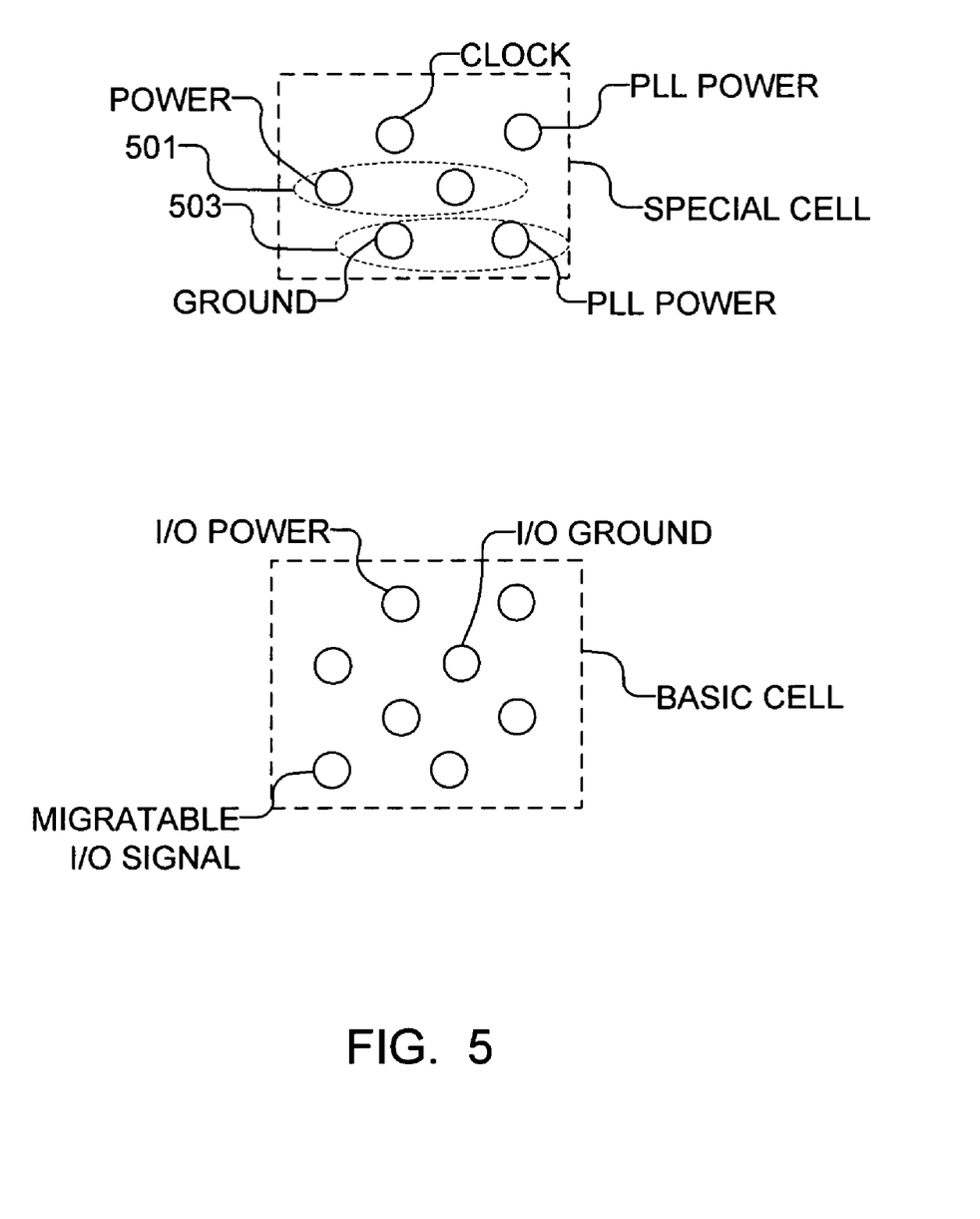
FIG. 5 shows exemplary configurations of cells of interconnection elements according to an embodiment of the present invention.

FIG. 5 shows exemplary configurations of a special cell and a basic cell according to an embodiment of the present invention. Both the special cell and basic cell include at least two interconnection elements (for example, two, three, four, or more interconnection elements). These interconnection elements can be arranged in one or more rows (for example, two, three, or more rows). In one embodiment, rows of interconnection elements can be staggered to allow conductive traces to fan-out (or fan-in) between interconnection elements. For example, row 501 is staggered from row 503. Accordingly, conductive traces can be disposed between interconnection elements of row 503 to connect an interconnection element of row 501 to a periphery region of the package substrate. In an alternative embodiment, a plurality of rows of interconnection elements can be staggered from each other.

The distribution of interconnection elements with certain functional assignments can be determined by design constraints. For example, it is advantageous to reduce the length of a ground path for an I/O signal (i.e., shorter return current loop). Therefore, the configuration of the basic cell (which includes both I/O ground(s) and I/O signals) provides a known ground location(s). Alternatively, the basic cell provides a known ratio of I/O signals to I/O power and ground, which can range from about 8:1 to about 2:1. Based on the disclosure and teachings provided herein, a person of ordinary skill in the art will know how to select the appropriate configuration of interconnection elements and functional assignments for a specific application.

Figure 6:
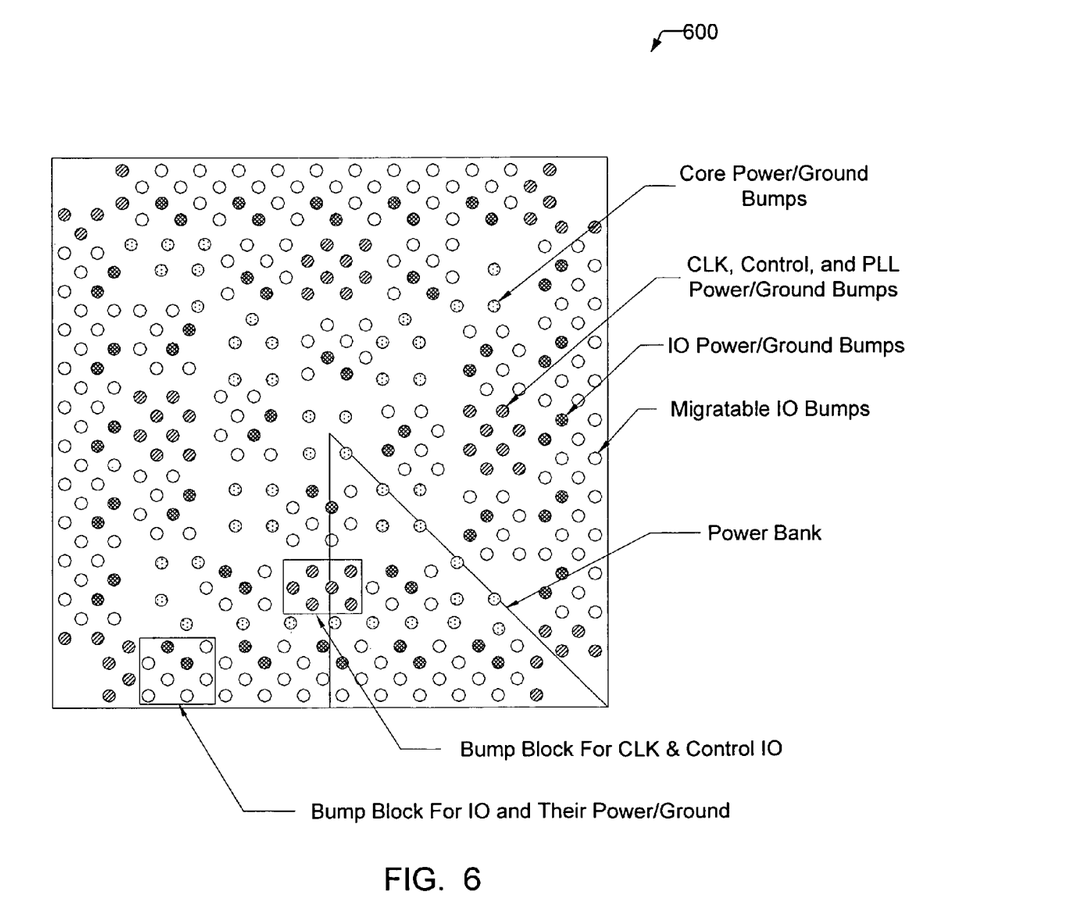
FIG. 6 is an exemplary interconnection layout for integrated circuit die according to an embodiment of the present invention.

FIG. 6 is an exemplary interconnection layout for integrated circuit die according to an embodiment of the present invention. This layout includes special cells and basic cells. In addition, unlike conventional dies which reserve the inner portion of the die exclusively for core power/ground, integrated circuit die 600 used the inner portion for I/O signals and others, as well as core power/ground.

Figure 7:
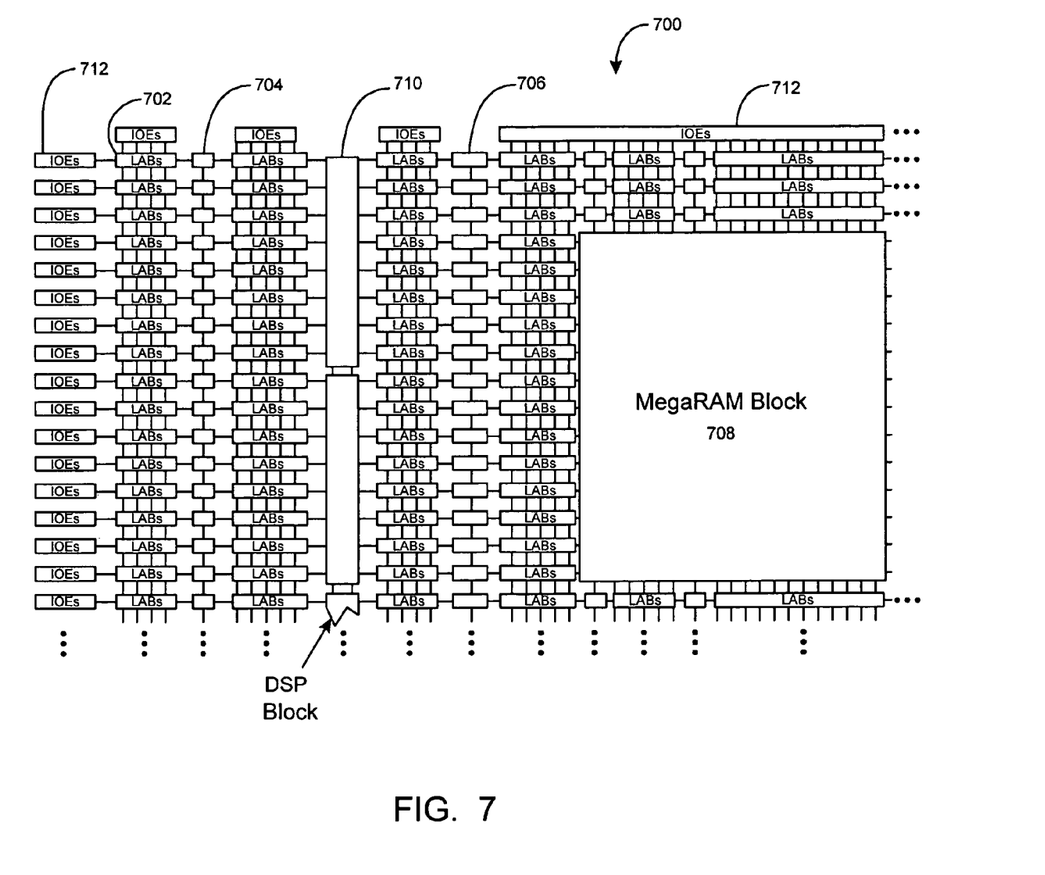
FIG. 7 is a simplified block diagram of a programmable logic device that can be used with the techniques of the present invention.

FIG. 7 is a simplified partial block diagram of one example of PLD 700 that can include aspects of the present invention. Although the present invention is discussed primarily in the context of PLDs and FPGAs (field-programmable gate arrays), it should be understood that the present invention can be applied to numerous types of programmable integrated circuits. PLD 700 is an example of a programmable integrated circuit in which techniques of the present invention can be implemented. PLD 700 includes a two-dimensional array of programmable logic array blocks (or LABs) 702 that are interconnected by a network of column and row signal lines of varying length and speed (referred to herein as an interconnect structure). LABs 702 include multiple (e.g., 10) logic elements (or LEs).

An LE is a programmable logic block that provides for efficient implementation of user defined logic functions. PLD has numerous logic elements that can be configured to implement various combinatorial and sequential functions. The logic elements have access to a programmable interconnect structure. The programmable interconnect structure can be programmed to interconnect the logic elements in almost any desired configuration.

PLD 700 also includes a distributed memory structure including RAM blocks of varying sizes provided throughout the array. The RAM blocks include, for example, 512 bit blocks 704, 4K blocks 706 and a MegaBlock 708 providing 512K bits of RAM. These memory blocks can also include shift registers and FIFO buffers.

PLD 700 further includes digital signal processing (DSP) blocks 710 that can implement, for example, multipliers with add or subtract features. I/O elements (IOEs) 7312 located, in this example, around the periphery of the device support numerous single-ended and differential I/O standards. It is to be understood that PLD 700 is described herein for illustrative purposes only and that the present invention can be implemented in many different types of PLDs, FPGAs, and the like.

Figure 8:
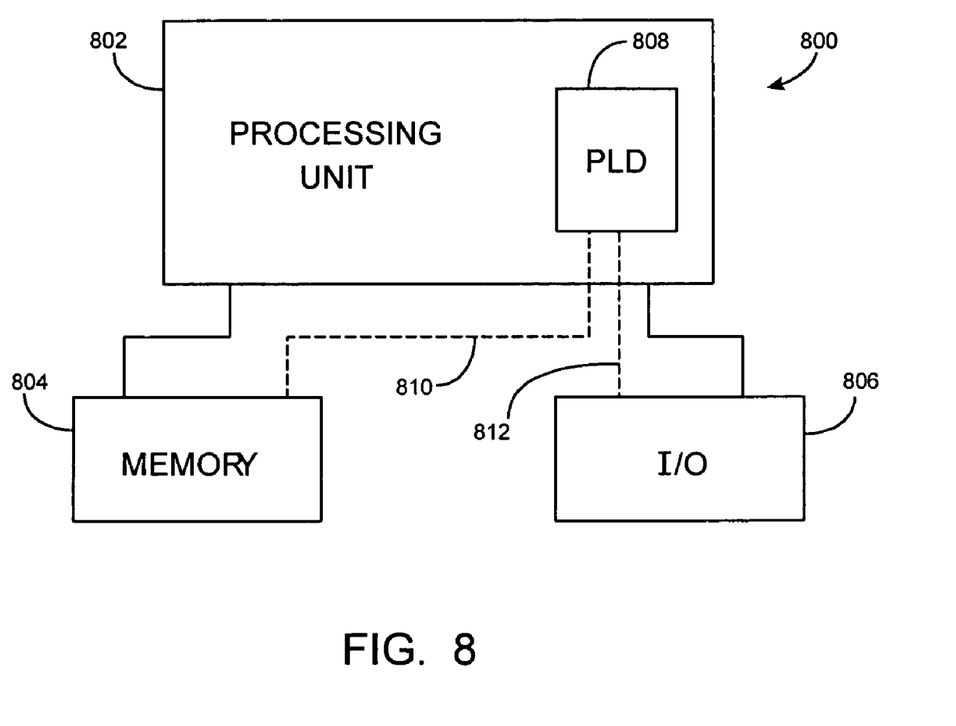
FIG. 8 is a block diagram of an electronic system that can implement embodiments of the present invention.

While PLDs of the type shown in FIG. 7 provide many of the resources required to implement system level solutions, the present invention can also benefit systems wherein a PLD is one of several components. FIG. 8 shows a block diagram of an exemplary digital system 800, within which the present invention can be embodied. System 800 can be a programmed digital computer system, digital signal processing system, specialized digital switching network, or other processing system. Moreover, such systems can be designed for a wide variety of applications such as telecommunications systems, automotive systems, control systems, consumer electronics, personal computers, Internet communications and networking, and others. Further, system 800 can be provided on a single board, on multiple boards, or within multiple enclosures.

System 800 includes a processing unit 802, a memory unit 804 and an I/O unit 806 interconnected together by one or more buses. According to this exemplary embodiment, a programmable logic device (PLD) 808 is embedded in processing unit 802. PLD 808 can serve many different purposes within the system in FIG. 8. PLD 808 can, for example, be a logical building block of processing unit 802, supporting its internal and external operations. PLD 408 is programmed to implement the logical functions necessary to carry on its particular role in system operation. PLD 808 can be specially coupled to memory 804 through connection 810 and to I/O unit 806 through connection 812.

Processing unit 802 can direct data to an appropriate system component for processing or storage, execute a program stored in memory 804 or receive and transmit data via I/O unit 806, or other similar function. Processing unit 802 can be a central processing unit (CPU), microprocessor, floating point coprocessor, graphics coprocessor, hardware controller, microcontroller, programmable logic device programmed for use as a controller, network controller, and the like. Furthermore, in many embodiments, there is often no need for a CPU.

For example, instead of a CPU, one or more PLDs 808 can control the logical operations of the system. In an embodiment, PLD 808 acts as a reconfigurable processor, which can be reprogrammed as needed to handle a particular computing task. Alternately, programmable logic device 808 can itself include an embedded microprocessor. Memory unit 804 can be a random access memory (RAM), read only memory (ROM), fixed or flexible disk media, PC Card flash disk memory, tape, or any other storage means, or any combination of these storage means.

While the present invention has been described herein with reference to particular embodiments thereof, a latitude of modification, various changes, and substitutions are intended in the present invention. In some instances, features of the invention can be employed without a corresponding use of other features, without departing from the scope of the invention as set forth. Therefore, many modifications may be made to adapt a particular configuration or method disclosed, without departing from the essential scope and spirit of the present invention. It is intended that the invention not be limited to the particular embodiments disclosed, but that the invention will include all embodiments and equivalents falling within the scope of the claims.

What is claimed is:

1. A programmable logic device implemented in an integrated circuit having interconnection elements for coupling with a package substrate, the integrated circuit comprising:
   a two-dimensional array of programmable logic array blocks that are interconnected by a network of column and row signal lines;
   a first set of interconnection elements, each having a functional assignment, wherein at least two of the interconnection elements have different functional assignments; and
   a second set of interconnection elements, each having a functional assignment, the first and second set of interconnection elements having a same number and arrangement of interconnection elements, wherein each interconnection element of the first set has a same functional assignment as the corresponding interconnection element of the second set,
   wherein the integrated circuit has more functional circuit elements as compared to a reference integrated circuit,
   wherein the first set of interconnection elements are disposed within an interior area of the integrated circuit that matches a size and shape of the reference integrated circuit, and wherein the second set of interconnection elements are disposed on the integrated circuit outside of the interior area.

2. The programmable logic device of claim 1 wherein the first set of interconnection elements includes elements with functional assignments of I/O signal, power, and ground.

3. The programmable logic device of claim 1 wherein the first set of interconnection elements includes elements with functional assignments of I/O control, phase-locked loop (PLL) power, and clock.

4. The programmable logic device of claim 1 wherein the first and second set of interconnection elements are disposed at about a boundary of a power bank.

5. The programmable logic device of claim 1 wherein the first set of interconnection elements comprises a first row and a second row of interconnection elements, the first and second rows being in a staggered pattern.

6. The programmable logic device of claim 1 wherein the first set of interconnection elements comprises at least three rows of interconnection elements.

7. The programmable logic device of claim 1 wherein the first set of interconnection elements comprises at least two interconnection elements.

8. The programmable logic device of claim 1 wherein the first and second set of interconnection elements are disposed within a slice of the integrated circuit, the slice being about ⅛th of an area of the integrated circuit.

9. The programmable logic device of claim 8 wherein the slice includes three edges arranged in a triangular shape, a first edge of the three edges coinciding with an edge of the integrated circuit.

10. The programmable logic device of claim 1 wherein interconnection elements of the first and second set of interconnection elements are disposed within a power bank and are configured for a first I/O voltage standard, and wherein interconnection elements of a third set of interconnection elements are disposed outside the power bank and are configured for a second I/O voltage standard.

11. The programmable logic device of claim 10 wherein the first I/O voltage standard and the second I/O voltage standard are each at least one of 0-2.5 volts logic standard, 0-3.3 volts logic standard, 0-5 volts logic standard, 0-3 volts logic standard, 0-1.8 volts logic standard, 0-1.5 volts logic standard, differential 2.0 volts standard, and differential 1.4 volts standard, and
the first I/O voltage standard and the second I/O voltage standard are different standards.

12. The programmable logic device of claim of 1 wherein the first and second set of interconnection elements each has a ratio of interconnection elements having a functional assignment of I/O signal to interconnection elements having a functional assignment of I/O power or ground in a range of about 8:1 to about 2:1.

13. A programmable logic device having pin elements for coupling with a package substrate, the programmable logic device comprising:
a two-dimensional array of programmable logic array blocks that are interconnected by a network of column and row signal lines, each of the programmable logic array blocks includes a plurality of logic elements;
a first set of interconnection elements, each having a functional assignment, wherein at least two of the interconnection elements have different functional assignments; and
a second set of interconnection elements, each having a functional assignment, the first and second set of interconnection elements having a same number and arrangement of interconnection elements, wherein each interconnection element of the first set has a same functional assignment as the corresponding interconnection element of the second set,
wherein:
the programmable logic device has more functional circuit elements as compared to a reference programmable logic device,
the first set of interconnection elements are disposed within an area matching a size and shape of the reference integrated circuit,
the first set of interconnection elements are disposed within an interior area of the integrated circuit that matches a size and shape of the reference integrated circuit,
the second set of interconnection elements are disposed on the integrated circuit outside of the interior area,
the programmable logic device is adapted to operate with a first voltage standard within a first slice of the programmable logic device and a second voltage standard within a second slice of the programmable logic device, and
the first and second set of interconnection elements are disposed within the first slice.

14. The programmable logic device of claim 13 further comprising an on-chip nonprogrammable application-specific integrated circuit (ASIC) core.

15. An integrated circuit having interconnection elements for coupling with a package substrate, the integrated circuit comprising:
a first set of interconnection elements having at least two interconnection elements with different functional assignments; and
a second set of interconnection elements, the first and second set of interconnection elements having a matching arrangement of interconnection elements and having corresponding interconnection elements with the same functional assignments,
the first and second set of interconnection elements having a same number and arrangement of interconnection elements, wherein each interconnection element of the first set has a same functional assignment as the corresponding interconnection element of the second set,
wherein the integrated circuit has more functional circuit elements as compared to a reference integrated circuit, wherein the first set of interconnection elements are disposed within an interior area of the integrated circuit that matches a size and shape of the reference integrated circuit, and wherein the second set of interconnection elements are disposed on the integrated circuit outside of the interior area.

16. The integrated circuit of claim 15 wherein the first set and the second set of interconnection elements both lie along the a line from a center of the integrated circuit to an edge of the integrated circuit.

17. The integrated circuit of claim 16 wherein the line extends diagonally from a corner of the integrated circuit to the center of the integrated circuit.

18. The integrated circuit of claim 15 wherein the first set of interconnection elements includes elements with functional assignments of I/O signal, power, and ground.

19. The integrated circuit of claim 15 wherein the first set of interconnection elements includes elements with functional assignments of I/O control, phase-locked loop (PLL) power, and clock.

20. The integrated circuit of claim 15 wherein the first and second set of interconnection elements are disposed at about a boundary of a power bank.

21. The integrated circuit of claim 15 wherein the first set of interconnection elements comprises a first row and a second row of interconnection elements, and wherein the interconnection elements of the first and second rows are in a staggered pattern.

22. The integrated circuit of claim 15 wherein the first set of interconnection elements comprises at least three rows of interconnection elements.

23. The integrated circuit of claim 15 wherein the first and second set of interconnection elements are disposed within a slice of the integrated circuit, the slice being about ⅛th of an area of the integrated circuit.

24. The integrated circuit of claim 23 wherein the slice includes three edges arranged in a triangular shape, a first edge of the three edges coinciding with an edge of the integrated circuit.

25. The integrated circuit of claim 23 wherein all interconnections elements within the slice are adapted to use the same voltage standard.

* * * * *